(12) United States Patent
Zhao et al.

(10) Patent No.: US 11,929,368 B2
(45) Date of Patent: Mar. 12, 2024

(54) ARRAY SUBSTRATE AND DISPLAY PANEL

(71) Applicant: Yungu (Gu'an) Technology Co., Ltd., Hebei (CN)

(72) Inventors: Dongfang Zhao, Langfang (CN); Kookchul Moon, Langfang (CN); Junfeng Li, Langfang (CN); Zhe Du, Langfang (CN); Yong Ge, Langfang (CN); Sha Yuan, Langfang (CN); Lin Xu, Langfang (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 378 days.

(21) Appl. No.: 17/519,222

(22) Filed: Nov. 4, 2021

(65) Prior Publication Data
US 2022/0059576 A1 Feb. 24, 2022

Related U.S. Application Data

(63) Continuation of application No. PCT/CN2020/105066, filed on Jul. 28, 2020.

(30) Foreign Application Priority Data

Nov. 28, 2019 (CN) .......................... 201911192059.4

(51) Int. Cl.
H01L 27/12 (2006.01)
(52) U.S. Cl.
CPC ...... H01L 27/1237 (2013.01); H01L 27/1259 (2013.01)
(58) Field of Classification Search
CPC ............ H01L 27/1237; H01L 27/1259; H10K 59/1213
See application file for complete search history.

(56) References Cited

U.S. PATENT DOCUMENTS

2007/0194326 A1  8/2007  Huh
2021/0280666 A1* 9/2021  Sohn ...................... H01L 21/02

FOREIGN PATENT DOCUMENTS

CN     103456765 A    12/2013
CN     103715226 A     4/2014
(Continued)

OTHER PUBLICATIONS

International Search Report dated Nov. 3, 2020 in corresponding International Application No. PCT/CN2020/105066; 4 pages.
(Continued)

Primary Examiner — Mohammed R Alam
(74) Attorney, Agent, or Firm — Maier & Maier, PLLC

(57) ABSTRACT

An array substrate and a display panel. The array substrate includes a thin film transistor array layer including a driving transistor, a switching transistor, and a capacitor. The driving transistor includes a first active layer, a first gate insulating layer, a first gate, and an insulating dielectric layer sequentially stacked. The switching transistor includes a second active layer, a second gate insulating layer, and a second gate sequentially stacked. The insulating dielectric layer and the second gate insulating layer are located at a same layer. A thickness of the first gate insulating layer is greater than a thickness of the second gate insulating layer. The capacitor includes a first electrode plate and a second electrode plate. The first electrode plate and the first gate are disposed on same layer, and the second electrode plate and the second gate are disposed on same layer.

19 Claims, 4 Drawing Sheets

(56) References Cited

FOREIGN PATENT DOCUMENTS

| | | |
|---|---|---|
| CN | 104659285 A | 5/2015 |
| CN | 107731858 A | 2/2018 |
| CN | 108292683 A | 7/2018 |
| CN | 109659339 A | 4/2019 |
| CN | 109872998 A | 6/2019 |
| CN | 109887973 A | 6/2019 |
| CN | 110880518 A | 3/2020 |
| KR | 20130098739 A | 9/2013 |

OTHER PUBLICATIONS

First Search dated Jan. 5, 2021 in corresponding Chinese Application No. 201911192059.4; 1 pages.
First Office Action dated Jan. 13, 2021 in corresponding Chinese Application No. 201911192059.4; 16 pages.
Second Office Action dated Apr. 1, 2021 in corresponding Chinese Application No. 201911192059.4; 18 pages.

\* cited by examiner

ARRAY SUBSTRATE AND DISPLAY PANEL

CROSS-REFERENCE TO RELATED APPLICATION(S)

This application is a continuation of International Patent Application No. PCT/CN2020/105066, filed Jul. 28, 2020, which claims priority to Chinese Patent Application No. 201911192059.4 filed on Nov. 28, 2019, the disclosures of both of which are incorporated herein by reference in their entireties.

TECHNICAL FIELD

Embodiments of the present application relate to the field of display technologies and, in particular, to an array substrate, a preparation method of an array substrate, and a display panel.

BACKGROUND

With the development of display technologies, the application of an organic light-emitting display panel is becoming more and more extensive.

The organic light-emitting display panel generally includes a plurality of organic light-emitting elements and a driving circuit configured to drive the organic light-emitting elements to emit light. The driving circuit generally includes a driving transistor and a switching transistor.

However, due to a structure of the organic light-emitting display panel, it is difficult to simultaneously optimize a driving capability of the driving transistor and a control capability of the switching transistor.

SUMMARY

Embodiments of the present application provide an array substrate, a preparation method of an array substrate and a display panel, so that the driving capability of a driving transistor and the control capability of a switching transistor can be simultaneously optimized.

In a first aspect, embodiments of the present disclosure provide an array substrate. The array substrate includes a thin film transistor array layer.

The thin film transistor array layer includes a driving transistor, a switching transistor and a capacitor.

The driving transistor includes a first active layer, a first gate insulating layer, a first gate and an insulating dielectric layer, wherein the first active layer, the first gate insulating layer, the first gate and the insulating dielectric layer are sequentially stacked.

The switching transistor includes a second active layer, a second gate insulating layer and a second gate, wherein the second active layer, the second gate insulating layer and the second gate are sequentially stacked.

The insulating dielectric layer and the second gate insulating layer are located at a same layer; a thickness of the first gate insulating layer is greater than a thickness of the second gate insulating layer; the capacitor includes a first electrode plate and a second electrode plate, wherein the first electrode plate and the first gate are disposed at a same layer, and the second electrode plate and the second gate are disposed at a same layer.

In a second aspect, embodiments of the present application further provide a display panel. The display panel includes the array substrate described in the first aspect.

Embodiments of the present application provide an array substrate and a display panel. The array substrate includes a thin film transistor array layer. In the thin film transistor array layer, a first gate of a driving transistor and a second gate of a switching transistor are located on different film layers. Accordingly, a first gate insulating layer between the first gate and a first active layer and a second gate insulating layer between the second gate and a second active layer are also not located at a same film layer. Moreover, a thickness of the first gate insulating layer is greater than a thickness of the second gate insulating layer. In this manner, a gate capacitance of the driving transistor is greater than a gate capacitance of the switching transistor, so that a subthreshold swing of the driving transistor is relatively great, and meanwhile a subthreshold swing of the switching transistor is relatively small, and thus the driving capability of the driving transistor and the switching control capability of the switching transistor can be simultaneously ensured, which is conducive to simultaneously achieving an accurate control to grayscale by the driving transistor and a relatively fast switching speed of the switching transistor.

DETAILED DESCRIPTION

As described in the BACKGROUND section, due to the structure of the organic light-emitting display panel, it is difficult to simultaneously optimize the driving capability of the driving transistor and the control capability of the switching transistor. According to the inventor's research, in the organic light-emitting display panel, the driving transistor and the switching transistor in an array substrate generally have a same structure. In an example, a gate of the driving transistor and a gate of the switching transistor are generally located at a same metal layer. Accordingly, a gate insulating layer of the driving transistor and a gate insulating layer of the switching transistor have a same structure and a same thickness. The driving capability of the driving transistor and the switching control capability of the switching transistor are both related to the thickness of the gate insulating layer. The greater the thickness of the gate insulating layer is, the stronger the driving capability of the driving transistor is; the smaller the thickness of the gate insulating layer is, the stronger the switching control capability of the switching transistor is. In the display panel, as the gate insulating layer of the switching transistor and the gate insulating layer of the driving transistor have the same structure and have the same thickness, an increase of the thickness of the gate insulating layer of the driving transistor and a decrease of the thickness of the gate insulating layer of the switching transistor cannot be simultaneously achieved. Therefore, it is difficult to simultaneously optimize the driving capability of the driving transistor and the switching control capability of the switching transistor.

Figure 1:
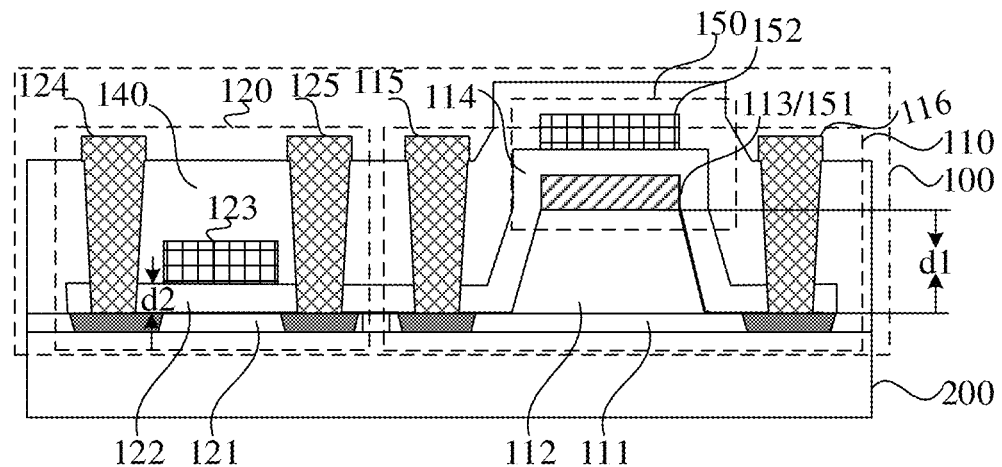
FIG. 1 is a schematic diagram of an array substrate according to an embodiment of the present application.

This embodiment provides an array substrate. FIG. 1 is a schematic diagram of an array substrate according to an embodiment of the present application. Referring to FIG. 1, the array substrate includes a thin film transistor array layer 100, wherein the thin film transistor array layer 100 includes a driving transistor 110, a switching transistor 120 and a capacitor 150.

The driving transistor 110 includes a first active layer 111, a first gate insulating layer 112, a first gate 113 and an insulating dielectric layer 114; and the first active layer 111, the first gate insulating layer 112, the first gate 113 and the insulating dielectric layer 114 are sequentially stacked.

The switching transistor 120 includes a second active layer 121, a second gate insulating layer 122 and a second gate 123; and the second active layer 121, the second gate insulating layer 122 and the second gate 123 are sequentially stacked.

The insulating dielectric layer 114 and the second gate insulating layer 122 are located at a same layer; and a thickness d1 of the first gate insulating layer 112 is greater than a thickness d2 of the second gate insulating layer 122.

The capacitor 150 includes a first electrode plate 151 and a second electrode plate 152, wherein the first electrode plate 151 and the first gate 113 are disposed in a same layer, and the second electrode plate 152 and the second gate 123 are disposed in a same layer.

In the drawings of embodiments of the present application, a case that the first electrode plate 151 and the first gate 113 are arranged in the same layer, and the first electrode plate 151 is shielded by the first gate 113 is taken as an example for description, and it does not constitute a limitation to the present application. In an actual preparation, the first electrode plate 151 and the first gate 113 are disposed in the same layer and staggered.

Figure 2:
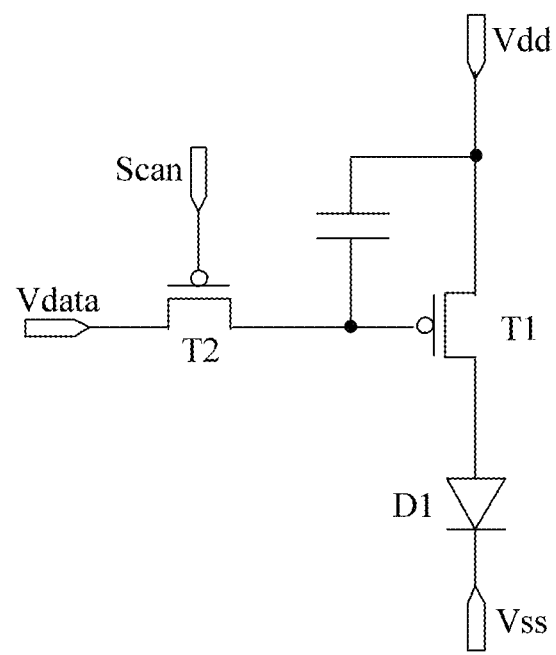
FIG. 2 is a conventional schematic diagram of a 2T1C pixel circuit.

In an exemplary embodiment, the thin film transistor array layer 100 generally includes an active layer, a plurality of metal layers and a plurality of insulating layers. The active layer, the plurality of metal layers and the plurality of insulating layers form a plurality of thin film transistors, wherein the plurality of thin film transistors includes a driving transistor 110 and a switching transistor 120. A display panel such as an organic light-emitting diode (OLED) display panel and an micro LED display panel generally includes a plurality of light-emitting elements and a plurality of pixel circuits which drive the light-emitting elements to emit light, and each pixel circuit may include one driving transistor 110 and at least one switching transistor 120. FIG. 2 is a conventional schematic diagram of a 2T1C pixel circuit. Referring to FIG. 2, the pixel circuit includes a first transistor T1 and a second transistor T2, wherein the first transistor T1 is a driving transistor and the second transistor T2 is a switching transistor. The driving transistor is connected to an anode of a light-emitting element D1, and a cathode of the light-emitting element D1 is connected to a second electrical potential signal input terminal VSS. The driving transistor may generate a driving current, so that the light-emitting element D1 is driven to emit light. The switching transistor plays a role of switching control, that is, according to the signal input by the gate of the switching transistor, the switching transistor control the source of the switching transistor and the drain of the switching transistor to be turned on or turned off. For example, for the pixel circuit shown in FIG. 2, the first transistor T1 and the second transistor T2 are both P-type transistors. In a case that a low electrical potential signal is input to a scanning signal input terminal SCAN, the second transistor T2 (the switching transistor) is turned on, so that a data voltage input by a data voltage input terminal Vdata may be transmitted to the gate of the first transistor T1 (the driving transistor), and the first transistor T1 may generate a driving current according to the gate potential of the first transistor T1 and an electrical potential input by a first electrical potential signal input terminal Vdd of the source of the first transistor T1, and thus the light-emitting device D1 is driven to emit light.

A concept of a subthreshold swing of a thin film transistor is introduced below for description. The subthreshold swing is a performance indicator which measures a switched speed between an on state and an off state of the thin film transistor, and also indicates an amount of change in a gate voltage required for a source-drain current changed by ten times. Therefore, the smaller the subthreshold swing is, the more conducive to improving a switching speed of the switching transistor 120; and the greater the subthreshold swing is, the more conducive to controlling a grayscale by the driving transistor 110.

To ensure a display effect of the display panel, the switching transistor 120 needs to have a good switching control capability, that is, the switching transistor 120 needs to have a relatively fast switching speed, which may be expressed that the subthreshold swing of the switching transistor 120 is relatively small; meanwhile, the driving transistor 110 needs to have a good driving capability, that is, the driving transistor 110 needs to have an accurate control capability to grayscale, which may be expressed that the subthreshold swing of the driving transistor 110 is relatively great. The subthreshold swing of the thin film transistor depends on a gate capacitance (a capacitance between the gate of the thin film transistor and the active layer of the thin film transistor) of the thin film transistor. The smaller the gate capacitance is, the greater the subthreshold swing of the thin film transistor is. The gate capacitance depends on a thickness of the gate insulating layer. The greater the thickness of the gate insulating layer is, the smaller the gate capacitance is.

The driving transistor 110 and the switching transistor 120 included in the array substrate provided in this embodiment may both be a transistor with a top-gate structure or may both be a transistor with a bottom-gate structure. In the array substrate shown in FIG. 1, the driving transistor 110 and the switching transistor 120 are both a top-gate structure. Referring to FIG. 1, different from an array substrate in the related art that the gate insulating layer of the switching transistor 120 and the gate insulating layer of the driving transistor 110 have a same structure and a same thickness, in the present array substrate, the gate insulating layer of the driving transistor 110 and the gate insulating layer of the switching transistor 120 have different structures, and the thickness of the gate insulating layer of the driving transistor 110 is greater than the thickness of the gate insulating layer of the switching transistor 120. In an exemplary embodiment, the array substrate includes a base substrate 200, and the array substrate is formed on a side of the base substrate 200. The driving transistor 110 includes the first active layer 111, the first gate insulating layer 112, the first gate 113 and the insulating dielectric layer 114 which are sequentially stacked on a side of the base substrate 200. The switching transistor 120 includes a second active layer 121, a second gate insulating layer 122 and a second gate 123 which are sequentially stacked.

Referring to FIG. 1, in a case that the thin film transistor array layer 100 is formed, the first active layer 111 of the driving transistor 110 and the second active layer 121 of the switching transistor 120 may be formed on a side of the base substrate 200 firstly. In some embodiments, the first active layer 111 and the second active layer 121 are located at a same layer, and the first active layer 111 and the second active layer 121 are made from a same or substantially similar material such as an inorganic material such as silicon, an organic semiconductor material, or an oxide semiconductor material.

After the first active layer 111 and the second active layer 121 are formed, the first gate insulating layer 112 and the first gate 113 may be formed. The first gate insulating layer 112 is formed only between the first gate 113 and the first active layer 111 of the driving transistor 110. The first gate insulating layer 112 may be a single-layer structure or a multi-layer structure. For example, in a case that the first gate insulating layer 112 is a single-layer structure, the material of the first gate insulating layer 112 may be silicon oxide or silicon nitride; and in a case that the first gate insulating layer 112 is a multi-layer structure, the first gate insulating layer 112 may be a structure with at least one silicon oxide layer and at least one silicon nitride layer alternately stacked. Since the first gate insulating layer 112 is formed only between the first gate 113 and the first active layer 111 of the driving transistor 110, after the material of the entire first gate insulating layer 112 and the material of the entire first gate 113 are formed, the material of the first gate 113 and the material of the first gate insulating layer 112 are etched with a same mask. For example, photoresist is coated on a side of the material of the entire first gate 113 facing away from the first gate insulating layer 112. The photoresist is taken as a mask plate, and the material of the entire first gate 113 and the material of the entire first gate insulating layer 112 are etched in two steps, in which only corresponding materials at the first gate 113 and the first gate insulating layer 112 shown in FIG. 1 are retained. In this manner, the process steps for preparing the array substrate can be simplified.

After the first gate 113 is formed, the insulating dielectric layer 114 of the driving transistor 110 may be formed. The insulating dielectric layer 114 and the second gate insulating layer 122 of the switching transistor 120 are located at a same layer. In an exemplary embodiment, the insulating dielectric layer 114 and the second gate insulating layer 122 may be an entire layer of the film structure in the thin film transistor array layer 100. Then, the second gate 123 may be formed on a side of the second gate insulating layer 122 facing away from the base substrate 200 and at a position corresponding to a channel region of the switching transistor 120. In some embodiments, the first gate 113 may be one of molybdenum (Mo), titanium (Ti) and copper (Cu), and the material of the second gate 123 may also be one of molybdenum (Mo), titanium (Ti) and copper (Cu).

Referring to FIG. 1, in the array substrate, since the first gate 113 of the driving transistor 110 and the second gate 123 of the switching transistor 120 are located at different film layers, the first gate insulating layer 112 between the first gate 113 and the first active layer 111 and the second gate insulating layer 122 between the second gate 123 and the second active layer 121 are also not located at a same film layer. Moreover, the thickness d1 of the first gate insulating layer 112 is greater than the thickness d2 of the second gate insulating layer 122. In this manner, the gate capacitance of the driving transistor 110 is smaller than the gate capacitance of the switching transistor 120, so that the subthreshold swing of the driving transistor 110 is relatively great, and meanwhile the subthreshold swing of the switching transistor 120 is relatively small, and thus the driving capability of the driving transistor 110 and the switching control capability of the switching transistor 120 can be simultaneously ensured, which is conducive to simultaneously achieving an accurate control to grayscale by the driving transistor 110 and a relatively fast switching speed of the switching transistor 120.

Referring to FIG. 1, in some embodiments, the base substrate 200 of the array substrate is disposed on a side of the first active layer 111 and the second active layer 121 facing away from the first gate insulating layer 112.

The thin film transistor array layer 100 further includes an interlayer insulating layer 140 and a source-drain layer. The source-drain layer includes a first source 115 of the driving transistor 110, a first drain 116 of the driving transistor 110, a second source 124 of the switching transistor 120, and a second drain 125 of the switching transistor 120. The interlayer insulating layer 140 is disposed on a side of the second gate 123 facing away from the base substrate 200, and the source-drain layer is disposed on a side of the interlayer insulating layer 140 facing away from the base substrate 200.

The first source 115 and the first drain 116 are electrically connected to the first active layer 111 through first via holes respectively, and the first via hole penetrates the interlayer insulating layer 140 and the insulating dielectric layer 114.

The second source 124 and the second drain 125 are electrically connected to the second active layer 121 through second via holes respectively, and the second via hole penetrates the interlayer insulating layer 140 and the second gate insulating layer 122.

Referring to FIG. 1, the first active layer 111 may include a first source region and a first drain region, the first source 115 may be connected to the first source region through the first via hole, and the first drain 116 may be connected to the first drain region through the first via hole. The second active layer 121 may include a second source region and a second drain region, the second source 124 may be connected to the second source region through the second via hole, and the second drain 125 may be connected to the second drain region through the second via hole. The first via hole penetrates the interlayer insulating layer 140 and the insulating dielectric layer 114, and the second via hole penetrates the interlayer insulating layer 140 and the second gate insulating layer 122, that is, the first gate insulating layer 112 is not disposed at the first via hole and the second via hole, so that the depths of the first via hole and the second via hole may be relatively small, and thus the manufacturing of the first via hole and the second via hole is relatively easy.

Figure 3:
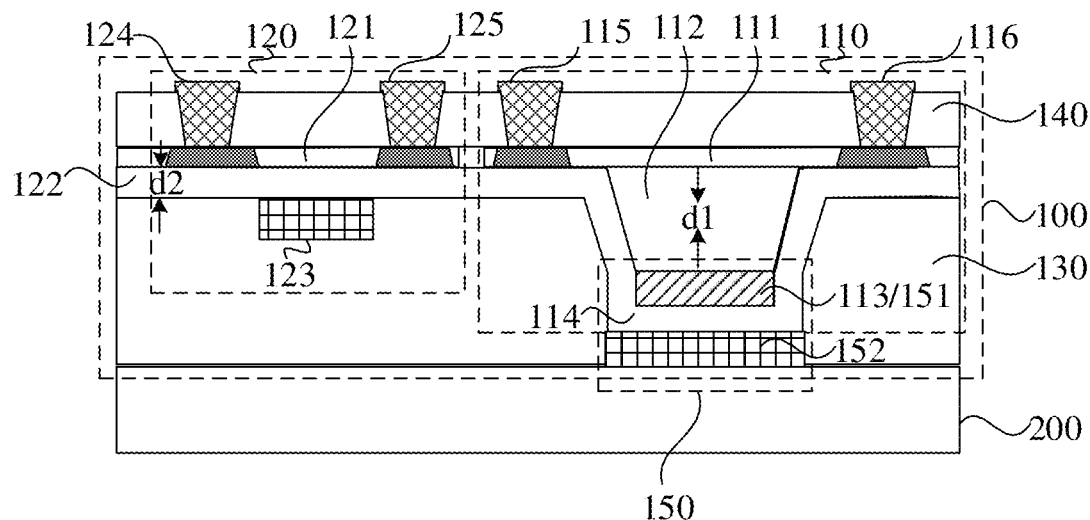
FIG. 3 is a schematic diagram of an array substrate according to another embodiment of the present application.

It is to be noted that the preceding description is based on that both the driving transistor 110 and the switching transistor 120 are a top-gate structure shown in FIG. 1. FIG. 3 is a schematic diagram of an array substrate according to another embodiment of the present application. Referring to FIG. 3, in the array substrate, both the driving transistor 110 and the switching transistor 120 are a bottom-gate structure. In this case, the base substrate 200 is disposed on a side of the second gate 123 facing away from the second active layer 121. In a case that the array substrate shown in FIG. 3 is formed, an organic layer or an inorganic layer 130 may be formed on a side of the base substrate 200 (that is, a side of the base substrate 200 facing to the second gate 123), and grooves with different depths are formed at positions corresponding to the driving transistor 110 and the switching transistor 120 and on a side of the organic layer or the inorganic layer 130 facing away from the base substrate 200. A depth of a groove corresponding to the driving transistor 110 is greater than a depth of a groove corresponding to the switching transistor 120, and then the second gate 123 and the second electrode plate 152 which are located at a same layer, the insulating dielectric layer 114 and the second gate insulating layer 122 which are located at a same layer, the first electrode plate 151 and the first gate 113 which are located at a same layer, the first gate insulating layer 112, and the first active layer 111 and the second active layer 121 which are located at a same layer are sequentially formed. In the array substrate, a thickness d1 of the first gate insulating layer 112 is also greater than a thickness d2 of the second gate insulating layer 122, and in the array substrate in which both the driving transistor 110 and the switching transistor 120 are a bottom-gate structure, an accurate control to grayscale by the driving transistor 110 and a relatively fast switching speed of the switching transistor 120 can be simultaneously achieved.

Referring to FIG. 3, in some embodiments, the base substrate 200 of the array substrate is disposed on a side of the second gate 123 facing away from the second gate insulating layer 122.

The thin film transistor array layer 100 further includes an interlayer insulating layer 140 and a source-drain layer. The source-drain layer includes a first source 115 of the driving transistor 110, a first drain 116 of the driving transistor 110, a second source 124 of the switching transistor 120, and a second drain 125 of the switching transistor 120. The interlayer insulating layer 140 is disposed on a side of the first active layer 111 and the second active layer 121 facing away from the base substrate 200, and the source-drain layer is disposed on a side of the interlayer insulating layer 140 facing away from the base substrate 200.

The first source 115 and the first drain 116 are electrically connected to the first active layer 111 through first via holes respectively, and the first via hole penetrates the interlayer insulating layer 140.

The second source 124 and the second drain 125 are electrically connected to the second active layer 121 through second via holes respectively, and the second via hole penetrates the interlayer insulating layer 140.

Referring to FIG. 3, the first active layer 111 may include a first source region and a first drain region, the first source 115 may be connected to the first source region through the first via hole, and the first drain 116 may be connected to the first drain region through the first via hole. The second active layer 121 may include a second source region and a second drain region, the second source 124 may be connected to the second source region through the second via hole, and the second drain 125 may be connected to the second drain region through the second via hole.

In conjunction with FIG. 2, referring to FIGS. 1 and 3, the capacitor 150 is electrically connected to the gate of the driving transistor 110. The capacitor 150 may play a storage role in the pixel circuit, so that in a stage of the driving transistor 110 driving the light-emitting element D1 to emit light, a gate electrical potential of the driving transistor 110 can be maintained, and thus a stability of a driving current can be ensured. The first electrode plate 151 of the capacitor 150 and the first gate 113 may be formed in a same process, and the second electrode plate 152 and the second gate 123 may be formed in a same process.

The array substrate provided in embodiments of the present application includes the thin film transistor array layer. In the thin film transistor array layer, the first gate 113 of the driving transistor 110 and the second gate 123 of the switching transistor 120 are located in different film layers. Accordingly, the first gate insulating layer 112 between the first gate 113 and the first active layer 111 and the second gate insulating layer 122 between the second gate 123 and the second active layer 121 are also not located at a same film layer. Moreover, the thickness of the first gate insulating layer 112 is greater than the thickness of the second gate insulating layer 122. In this manner, a gate capacitance of the driving transistor 110 is smaller than a gate capacitance of the switching transistor 120, so that the subthreshold swing of the driving transistor 110 is relatively great, and meanwhile the subthreshold swing of the switching transistor 120 is relatively small, and thus the driving capability of the driving transistor 110 and the switching control capability of the switching transistor 120 can be simultaneously ensured, which is conducive to simultaneously achieving an accurate control to grayscale by the driving transistor 110 and a relatively fast switching speed of the switching transistor 120.

In some embodiments, the material of the insulating dielectric layer 114 includes at least one of hafnium oxide, zirconium oxide and aluminum oxide; and the material of the second gate insulating layer 122 includes at least one of hafnium oxide, zirconium oxide and aluminum oxide.

In an exemplary embodiment, a dielectric constant of each of hafnium oxide, zirconium oxide and aluminum oxide is relatively high. Since the insulating dielectric layer 114 is also a dielectric layer between the first electrode plate 151 of the capacitor 150 and the second electrode plate 152 of the capacitor 150, the material of the insulating dielectric layer 114 includes at least one of hafnium oxide, zirconium oxide and aluminum oxide, so that a capacitance of the capacitor 150 can be increased, which is conducive to enhancing the charging and discharging capacity of the capacitor 150, thereby achieving a low-frequency driving, and reducing a driving power consumption. Moreover, after the charging and discharging capability of the capacitor 150 is enhanced, the first gate insulating layer 112 of the driving transistor 110 may not be too thick (but the thickness d1 of the first gate insulating layer 112 is still greater than the thickness d2 of the second gate insulating layer 122), so that an uneven etching situation caused by the first gate insulating layer 112 which is too thick can be ameliorated.

The material of the second gate insulating layer 122 includes at least one of hafnium oxide, zirconium oxide and aluminum oxide. In this manner, the gate capacitance of the switching transistor 120 can be increased, so that the subthreshold swing of the switching transistor 120 can be reduced, and thus the switching control capability of the transistor 120 can be improved.

It is to be noted that the materials of the insulating dielectric layer 114 and the second gate insulating layer 122 may further include other materials with a dielectric constant which is equal to the dielectric constant of one of hafnium oxide, zirconium oxide and aluminum oxide, which is not limited in embodiments of the present application.

Figure 4:
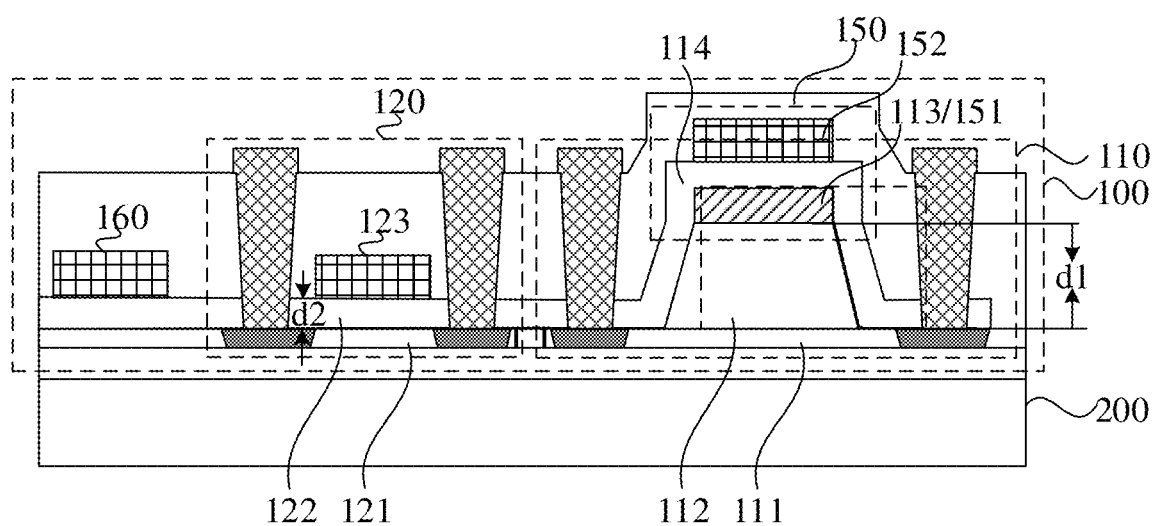
FIG. 4 is a schematic diagram of an array substrate according to another embodiment of the present application.

FIG. 4 is a schematic diagram of an array substrate according to another embodiment of the present application. Referring to FIG. 4, in some embodiments, the thin film transistor array layer 100 further includes a scanning line 160, and the scanning line 160 and the second gate 123 are disposed in a same layer.

In conjunction with FIG. 2, referring to FIG. 4, the scanning line 160 in the thin film transistor array layer 100 may be electrically connected to the second gate 123 of the switching transistor 120, that is, the scanning line 160 in the thin film transistor array layer 100 may be electrically connected to the scanning signal input terminal (Scan) in FIG. 2 so that a scanning signal is transmitted to the second gate 123 of the switching transistor 120, and thus the switching transistor 120 may be controlled to be turned on or turned off. As described above, the scanning line 160 is generally electrically connected to the second gate 123 of the switching transistor 120. Therefore, the scanning line 160 and the second gate 123 of the switching transistor 120 are disposed in a same layer, which facilitates a connection between the scanning line 160 and the switching transistor 120.

In some embodiments, the thickness of the first gate insulating layer 112 is 1300 to 4000 angstroms, and the thickness of the second gate insulating layer 122 is 200 to 1000 angstroms.

In some embodiments, the thickness of the first gate insulating layer 112 is 3000 angstroms, and the thickness of the second gate insulating layer 122 is 800 angstroms. As the thickness of the first gate insulating layer 112 is 1300 to 4000 angstroms, and the thickness of the second gate insulating layer 122 is 200 to 1000 angstroms, it is ensured that the thickness of the first gate insulating layer 112 is greater than the thickness of the second gate insulating layer 122, while it is ensured that the driving capability of the driving transistor 110 and the switching control capability of the switching transistor 120 are simultaneously improved. Further, it is also ensured that the thickness of the first gate insulating layer 110 and the thickness of the second gate insulating layer 120 are not too thick, which is conducive to achieving the thinning of the array substrate.

Figure 5:
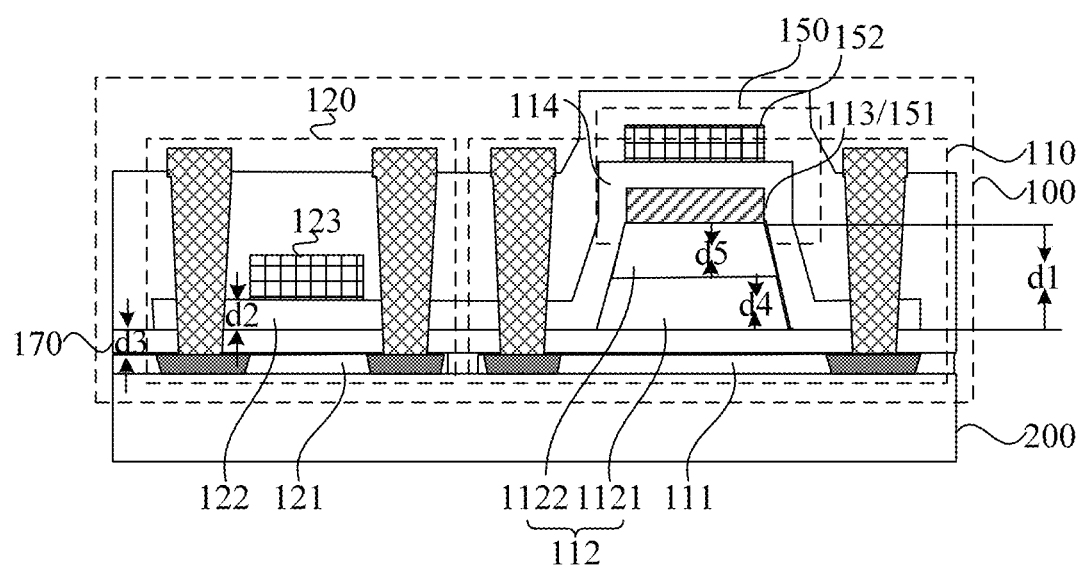
FIG. 5 is a schematic diagram of an array substrate according to another embodiment of the present application.

FIG. 5 is a schematic diagram of an array substrate according to another embodiment of the present application. Referring to FIG. 5, in some embodiments, the thin film transistor array layer 100 further includes a third gate insulating layer 170, wherein the third gate insulating layer 170 is disposed on a side of the first active layer 111 and the second active layer 121 facing to the first gate insulating layer 112.

Referring to FIG. 5, the thin film transistor array layer 100 includes a third gate insulating layer 170. The third gate insulating layer 170 and the first gate insulating layer 112 form the gate insulating layer of the driving transistor 110. Meanwhile, the third gate insulating layer 170 and the second gate insulating layer 122 form the gate insulating layer of the switching transistor 120.

Referring to FIG. 5, in some embodiments, the first gate insulating layer 112 includes a first sub-insulating layer 1121 and a second sub-insulating layer 1122 which are sequentially stacked, and the first sub-insulating layer 1121 is disposed between the second sub-insulating layer 1122 and the third gate insulating layer 170; the material of the third gate insulating layer 170 is silicon oxide, the material of the first sub-insulating layer 1121 is silicon nitride, and the material of the second sub-insulating layer 1122 is silicon oxide. In this manner, in three insulating layers (the third gate insulating layer 170, the first sub-insulating layer 1121, and the second sub-insulating layer 1122 which are stacked) between the first gate 113 and the first active layer 111 of the driving transistor 110, the materials of the third gate insulating layer 170 and the second sub-insulating layer 1122 which are located on two sides are the same, and the material of the first sub-insulating layer 1121 in the middle is different from the materials of the insulating layers on two sides, so that in a case when the first sub-insulating layer 1121 and the second sub-insulating layer 1122 are etched, it is convenient to detect an etching end of each of the second sub-insulating layer 1122 and the first sub-insulating layer 1121, and thus a uniformity of the third gate insulating layer 170 can be ensured. In some embodiments, a thickness of the third gate insulating layer 170 is 500 angstroms, the thickness of the first sub-insulating layer 1121 is 1000 angstroms, and the thickness of the second sub-insulating layer 1122 is 3000 angstroms. Table 1 is experimental data of the subthreshold swing of the switching transistor and the subthreshold swing of the driving transistor in the array substrate 1, and the subthreshold swing of the switching transistor and the subthreshold swing of the driving transistor in the array substrate 2. The structure and the thickness of the gate insulating layer of the switching transistor in the array substrate 1 are same as the structure and the thickness of the gate insulating layer of the driving transistor in the array substrate 1. For example, the material of the gate insulating layers of the switching transistor and the driving transistor are both silicon dioxide, and the thicknesses of the gate insulating layers of the switching transistor and the driving transistor are both 1200 angstroms. The array substrate 2 is the array substrate provided in the present embodiments, the first gate insulating layer 112 includes the first sub-insulating layer 1121 and the second sub-insulating layer 1122 which are sequentially stacked, the first sub-insulating layer 1121 is disposed between the second sub-insulating layer 1122 and the third insulating layer 170; the material of the third gate insulating layer 170 is silicon oxide, the material of the first sub-insulating layer 1121 is silicon nitride, and the material of the second sub-insulating layer 1122 is silicon oxide; the thickness d3 of the third gate insulating layer 170 is 500 angstroms, the thickness d4 of the first sub-insulating layer 1121 is 1000 angstroms, the thickness d5 of the second sub-insulating layer 1122 is 3000 angstroms, and the thickness d2 of the second gate insulating layer 122 is 800 angstroms.

TABLE 1

|  | Subthreshold Swing of the Switching Transistor | Subthreshold Swing of the Driving transistor |
| --- | --- | --- |
| Array substrate 1 | 0.23 ± 0.03 | 0.3 ± 0.06 |
| Array substrate 2 | 0.23 ± 0.03 | 0.55 ± 0.08 |

It can be seen from the preceding table that in the array substrate 2 of the present embodiments, the subthreshold swing of the driving transistor can be significantly increased, so that the driving capability of the driving transistor can be improved. Moreover, since the insulating dielectric layer 114 which is disposed in a same layer with the second gate insulating layer 122 is not the gate insulating layer of the driving transistor 110, those person skilled in the art may flexibly set the thickness of the second gate insulating layer 122 according to actual experience. In this manner, while the subthreshold swing of the driving transistor 110 is not changed, the subthreshold swing of the switching transistor 120 can be reduced, and thus the switching control capability of the switching transistor 120 can be improved.

Figure 6:
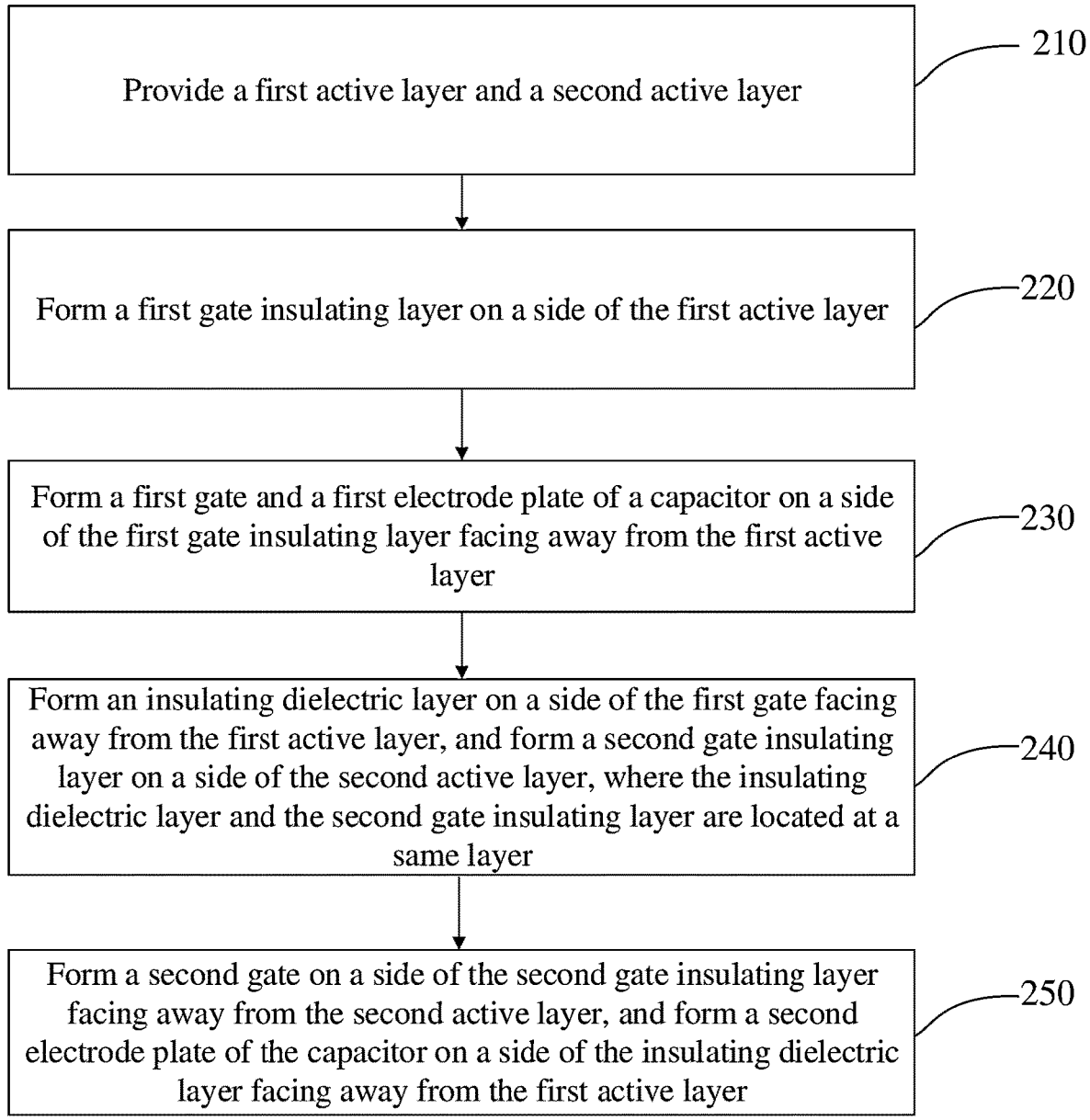
FIG. 6 is a flowchart of a preparation method of an array substrate according to an embodiment of the present application.

This embodiment further provides a preparation method for an array substrate. FIG. 6 is a flowchart of a preparation method of an array substrate according to an embodiment of the present application. Referring to FIG. 6, in some embodiments, the preparation method of an array substrate includes step 210 to step 250.

In step 210, providing a first active layer and a second active layer.

In step 220, forming a first gate insulating layer on a side of the first active layer.

In step 230, forming a first gate and a first electrode plate of a capacitor are on a side of the first gate insulating layer facing away from the first active layer.

In step 240, forming an insulating dielectric layer on a side of the first gate facing away from the first active layer, and forming a second gate insulating layer on a side of the second active layer, wherein the insulating dielectric layer and the second gate insulating layer are located at a same layer.

In step 250, forming a second gate on a side of the second gate insulating layer facing away from the second active layer, and forming a second electrode plate of the capacitor on a side of the insulating dielectric layer facing away from the first active layer.

The first gate insulating layer is a gate insulating layer of the driving transistor, and the second gate insulating layer is a gate insulating layer of the switching transistor, wherein a thickness of the first gate insulating layer is greater than a thickness of the second gate insulating layer.

In the preparation method of an array substrate provided in embodiments of the present application, the thickness of the first gate insulating layer of the driving transistor is greater than the thickness of the second gate insulating layer of the switching transistor. In this manner, the gate capacitance of the driving transistor is smaller than the gate capacitance of the switching transistor, so that the subthreshold swing of the driving transistor becomes relatively large, and meanwhile the subthreshold swing of the switching transistor becomes relatively small, and thus the driving capability of the driving transistor and the switching control capability of the switching transistor can be simultaneously ensured, which is conducive to simultaneously achieving an accurate control to grayscale by the driving transistor and a relatively fast switching speed of the switching transistor.

Figure 7:
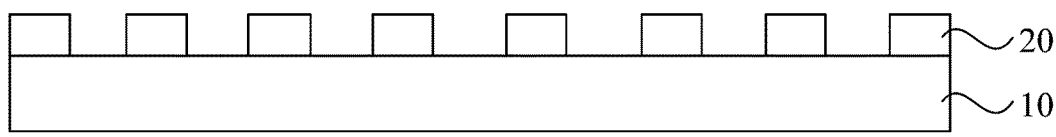
FIG. 7 is a schematic diagram of a display panel according to an embodiment of the present application.

Embodiments of the present application further provide a display panel. FIG. 7 is a schematic diagram of a display panel according to an embodiment of the present application. Referring to FIG. 7, the display panel includes the array substrate 10 provided in any embodiment of the present application and further includes a plurality of light-emitting elements 20 located on a side of the array substrate 10. The display panel may be an organic light-emitting display panel or an inorganic light-emitting display panel. In a case that the display panel is an organic light-emitting display panel, the display panel may include organic light-emitting elements on a side of the array substrate; and in a case that the display panel is an inorganic light-emitting display panel, the display panel may include inorganic light-emitting elements on a side of the array substrate, such as Micro-LED.

What is claimed is:

1. An array substrate, comprising:
a thin film transistor array layer, wherein the thin film transistor array layer comprises a driving transistor, a switching transistor and a capacitor,
wherein the driving transistor comprises a first active layer, a first gate insulating layer, a first gate and an insulating dielectric layer sequentially stacked;
the switching transistor comprises a second active layer, a second gate insulating layer and a second gate sequentially stacked; and
the insulating dielectric layer and the second gate insulating layer are located at a same layer; a thickness of the first gate insulating layer is greater than a thickness of the second gate insulating layer; the capacitor comprises a first electrode plate and a second electrode plate, wherein the first electrode plate and the first gate are disposed in a same layer, and the second electrode plate and the second gate are disposed in a same layer.

2. The array substrate of claim 1, wherein a material of the insulating dielectric layer comprises at least one of hafnium oxide, zirconium oxide and aluminum oxide, and a material of the second gate insulating layer comprises at least one of hafnium oxide, zirconium oxide and aluminum oxide.

3. The array substrate of claim 1, wherein the thin film transistor array layer further comprises a scanning line, and the scanning line and the second gate are disposed in a same layer.

4. The array substrate of claim 3, wherein the scanning line is electrically connected to the second gate of the switching transistor.

5. The array substrate of claim 1, wherein the thickness of the first gate insulating layer is 1300 to 4000 angstroms, and the thickness of the second gate insulating layer is 200 to 1000 angstroms.

6. The array substrate of claim 5, wherein the thickness of the first gate insulating layer is 3000 angstroms, and the thickness of the second gate insulating layer is 800 angstroms.

7. The array substrate of claim 1, wherein the thin film transistor array layer further comprises a third gate insulating layer, and the third gate insulating layer is disposed on a side of the first active layer and the second active layer facing to the first gate insulating layer.

8. The array substrate of claim 7, wherein the first gate insulating layer comprises a first sub-insulating layer and a second sub-insulating layer which are sequentially stacked, and the first sub-insulating layer is disposed between the second sub-insulating layer and the third gate insulating layer; and
a material of the third gate insulating layer is silicon oxide, a material of the first sub-insulating layer is silicon nitride, and a material of the second sub-insulating layer is silicon oxide.

9. The array substrate of claim 1, further comprising a base substrate disposed on a side of the first active layer and the second active layer facing away from the first gate insulating layer;
wherein the thin film transistor array layer further comprises an interlayer insulating layer and a source-drain layer, the source-drain layer comprises a first source of the driving transistor, a first drain of the driving transistor, a second source of the switching transistor and a second drain of the switching transistor; the interlayer insulating layer is disposed on a side of the second gate facing away from the base substrate, and the source-drain layer is disposed on a side of the interlayer insulating layer facing away from the base substrate;
wherein the first source and the first drain are electrically connected to the first active layer through first via holes respectively, and the first via hole penetrates the interlayer insulating layer and the insulating dielectric layer; and
the second source and the second drain are electrically connected to the second active layer through second via holes respectively, and the second via hole penetrates the interlayer insulating layer and the second gate insulating layer.

10. The array substrate of claim 9, wherein the first active layer comprises a first source region and a first drain region, the first source is connected to the first source region through the first via hole, and the first drain is connected to the first drain region through the first via hole; and the second active layer comprises a second source region and a second drain region, the second source is connected to the second source region through the second via hole, and the second drain is connected to the second drain region through the second via hole.

11. The array substrate of claim 1, further comprising a base substrate disposed on a side of the second gate facing away from the second gate insulating layer;
the thin film transistor array layer further comprises an interlayer insulating layer and a source-drain layer, the source-drain layer comprises a first source of the driving transistor, a first drain of the driving transistor, a second source of the switching transistor and a second drain of the switching transistor; the interlayer insulating layer is disposed on a side of the first active layer and the second active layer facing away from the base substrate, and the source-drain layer is disposed on a side of the interlayer insulating layer facing away from the base substrate;
wherein the first source and the first drain are electrically connected to the first active layer through first via holes respectively, and the first via hole penetrates the interlayer insulating layer; and
the second source and the second drain are respectively electrically connected to the second active layer through second via holes respectively, and the second via hole penetrates the interlayer insulating layer.

12. The array substrate of claim 11, wherein the first active layer comprises a first source region and a first drain region, the first source is connected to the first source region through the first via hole, and the first drain is connected to the first drain region through the first via hole; the second active layer comprises a second source region and a second drain region, and the second source is connected to the second source region through the second via hole, and the second drain is connected to the second drain region through the second via hole.

13. The array substrate of claim 11, wherein an organic layer or an inorganic layer is provided on a side of the base substrate facing to the second gate.

14. The array substrate of claim 1, wherein each of the driving transistor and the switching transistor is a transistor with a top-gate structure.

15. The array substrate of claim 1, wherein each of the driving transistor and the switching transistor is a transistor with a bottom-gate structure.

16. The array substrate of claim 1, wherein the first active layer and the second active layer are located at a same layer.

17. The array substrate of claim 1, wherein the first gate insulating layer is a single-layer structure or a multi-layer structure, in a case that the first gate insulating layer is the single-layer structure, a material of the first gate insulating layer is silicon oxide or silicon nitride; and in a case that the first gate insulating layer is the multi-layer structure, the first gate insulating layer is a structure with at least one silicon oxide layer and at least one silicon nitride layer alternately stacked.

18. The array substrate of claim 1, wherein a material of the first gate is one of molybdenum (Mo), titanium (Ti) and copper (Cu), and a material of the second gate is one of molybdenum (Mo), titanium (Ti) and copper (Cu).

19. A display panel, comprising the array substrate of claim 1.

* * * * *